US006587375B2

(12) United States Patent
Chung et al.

(10) Patent No.: US 6,587,375 B2
(45) Date of Patent: Jul. 1, 2003

(54) ROW DECODER FOR A NONVOLATILE MEMORY DEVICE

(75) Inventors: Hwi-Taek Chung, Kyunggi-do (KR); Seung-Keun Lee, Kyunggi-do (KR); Young-Ho Lim, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/923,718

(22) Filed: Aug. 6, 2001

(65) Prior Publication Data

US 2002/0036923 A1 Mar. 28, 2002

(30) Foreign Application Priority Data

Aug. 7, 2000 (KR) ........................................ 2000-45687

(51) Int. Cl.[7] .............................................. G11C 16/04
(52) U.S. Cl. .............................. 365/185.13; 365/185.11; 365/185.23
(58) Field of Search ................. 365/185.13, 185.11, 365/185.23, 230.03, 230.06, 185.01, 230.01

(56) References Cited

U.S. PATENT DOCUMENTS 5,621,690 A * 4/1997 Jungroth et al. ....... 365/185.09
5,808,945 A * 9/1998 Arase ...................... 365/200
5,978,263 A * 11/1999 Javanifard et al. ..... 365/185.11
6,233,198 B1 * 5/2001 Choi ....................... 365/189.11

* cited by examiner

Primary Examiner—Hoai Ho
(74) Attorney, Agent, or Firm—Marger Johnson & McCollom, P.C.

(57) ABSTRACT

The invention provides decoder circuits for selecting a word line in a semiconductor memory device which comprises a plurality of memory cell sectors including a plurality of word lines and bit lines and a plurality of memory cells which each is electrically erasable and programmable. The decoder circuits comprise a pull-up and pull-down transistors connected to global word lines which are connected to the word lines via connecting means, the decoder circuits turning on pull-down transistors before a high voltage according to an operation mode is supplied to one selected from the global word lines and pre-charging the gates of the pull-up transistors to the high voltage. The invention enables the decoder circuits to supply the word line drive voltage to the global word lines connected to memory cells by using the self-boosting method to thereby reduce the boosting load.

16 Claims, 10 Drawing Sheets

| Fig.1A | Fig.1B |

(Prior Art)

Fig. 3

(Prior Art)

Fig. 4

(Prior Art)

ROW DECODER FOR A NONVOLATILE MEMORY DEVICE

This application relies for priority upon Korean Patent Application No. 2000-45687, filed on Aug. 7, 2000, the contents of which are herein incorporated by reference in their entirety.

FIELD OF THE INVENTION

The present invention relates to a nonvolatile memory device and more particularly to a row decoder employed in the non-volatile semiconductor memory device.

BACKGROUND OF THE INVENTION

Generally, semiconductor memory devices for storing data are classified into volatile and non-volatile, the latter class including flash memory devices. In a flash semiconductor memory device its memory cells can be electrically programmed and data stored in the memory cells can be electrically erased. According to an operation of a normal flash memory device, programming of the memory cells is conducted by using the injection of hot electrons to a floating gate from a drain region and an adjacent channel region. To program the cells, a voltage of about 5V is applied to the drain region to generate hot electrons while a source region and a substrate (or a bulk) are grounded in common, and a high voltage of about 9V is applied to a control gate. As such, since the floating gate in the programmed memory cells is filled with negative charges, a threshold voltage of the memory cells is increased. To the contrary, to erase the cells, a negative high voltage of −9V is applied to the control gate while a counter voltage about 9V is applied to the bulk region, thereby causing migration of the negative charges from the floating gate to the bulk region (Fouler-Nordheim Tunneling). The threshold voltage of the memory cells whose data are erased becomes lower than those of the memory cells not erased. In a read-out operation, a voltage of about 1V is applied to the drain region, a lower voltage than a threshold voltage of the programmed memory cell also is applied to the control gate and at the same time 0V is applied to the source region so that the programmed memory cell is an "off-cell" and the erased memory cell is an "on cell".

When a read-out operation on the programmed memory cells or the memory cells whose data are erased is to be performed, a voltage between the threshold voltage of a programmed memory cell and that of a data erased memory cell is applied to a word line connected to a selected memory cell. One approach to resolve the problem whereby the read-out voltage is higher than a voltage of a power supply, boosting the read-out voltage is described in "A 2.7V only 8 Mb×16NOR flash memory", symposium on VLSI Circuits Digest of Technical Papers, IEEE 1996.

Recently there is a need for reducing power consumption in the flash memory used in devices such as a handheld communications device or a portable computer operated by a battery. However, the largest obstacle for lowering a used voltage together with very large scale integration (VLSI) is this: The larger the degree of integration, the lower the coefficient of the boosting voltage in the word line during a low-voltage read-out operation.

Some methods for solving this problem have ever been introduced. One of the methods is a process for multi-boosting the word line that enables the fast, low-voltage, read-out operation by increasing the coefficient of the boosting voltage. See ("Quick Double Bootstrapping Scheme for Word Line of 1.8V Only 16 Mb Flash Memory", the sixth Korean Semiconductor conference, February, 1999). Another is a process in which a charge pump, i.e., a high voltage generator, can be driven on being powered up, so that when a read-out operation is started a high voltage generated from the charge pump can be applied to word lines. This process recently becomes popular in use, since the process enables fast operational speed and lowers power consumption. See ("On-chip high voltage generation in NMOS integrated circuits using an improved voltage multiplier technique", J. F. Dickson, IEEE Journal of Solid State Circuits, Jun 1976, pages 374–378). The technologies that use the charge pump to boost the voltage of the word lines on a read-out operation under the low-power voltage are described in an "Optimization of word-line booster circuits for low-voltage flash memories", IEEE JSSC, Vol. 34, No. 8, Aug. 1999, pages 1091–1098. Therein are described the advantages of using the charge pump for generating the high voltage, since the circuit region and the operational currents of the charge pump are low compared to other periphery circuit components.

Meanwhile, a row decoder adapted in a NOR type flash memory device must be able to supply different levels of voltages from a negative high-voltage to a positive high-voltage due. This is because of the flash memory as described above. In general, a high voltage refers to a voltage having a potential higher than the potential of the voltage of the power supply. That is, in the case of a 3/3V power supply voltage, about 4.5V can be applied to the selected word line on a read-out operation, about 9V can be applied to the selected word line on the programming operation, and about 9V and −9V can be applied to the word line and the bulk region, respectively, on the erasure operation. One circuit supplying such voltages, as well as the row decoder and its associated circuits in conventional device are illustrated in FIG. 1.

Figures 1, 1A:
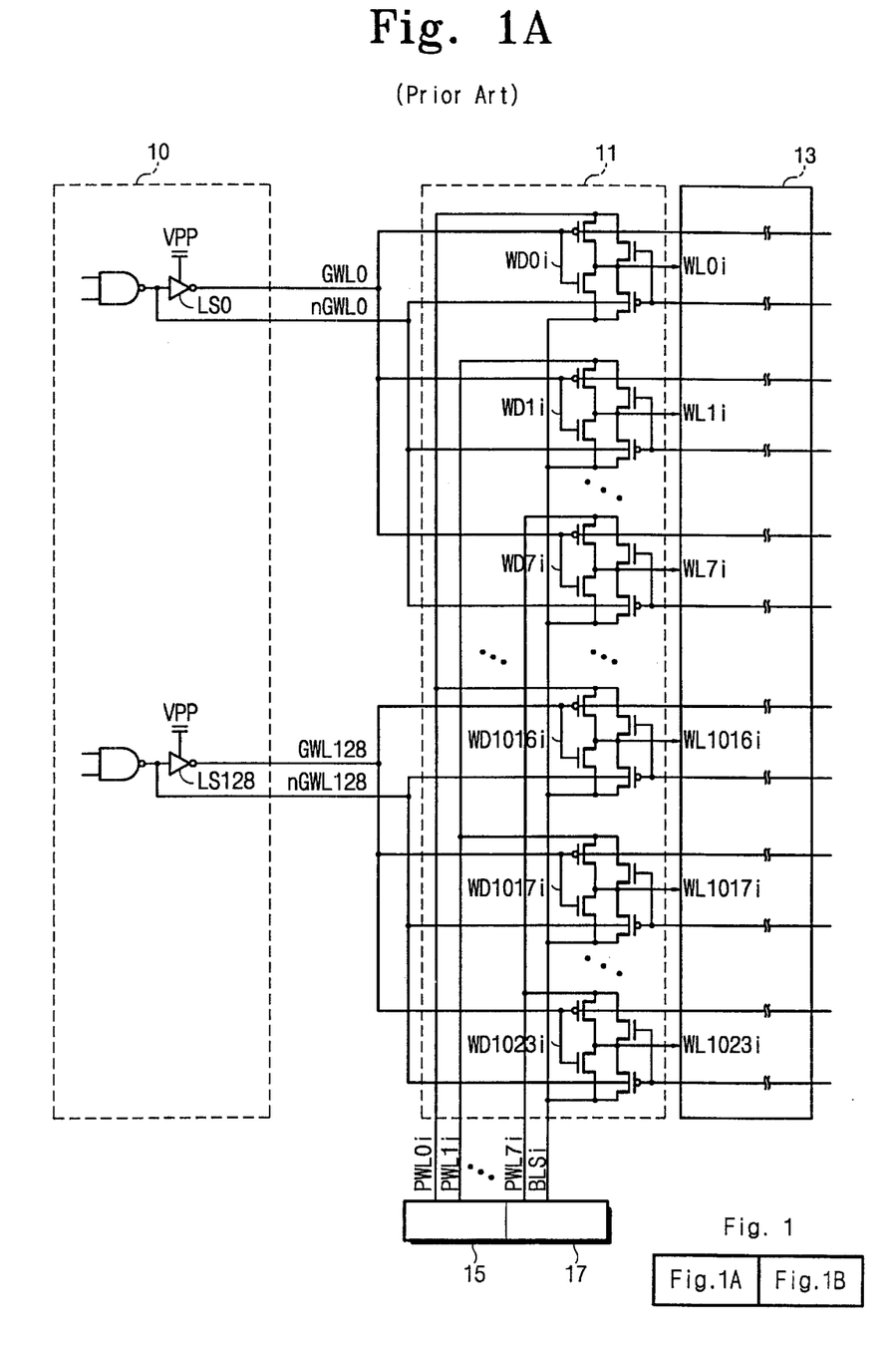
FIGS. 1A and 1B are a schematic diagram illustrating a prior art structure driving the word lines in a flash memory device (hereinafter FIG. 1=FIGS. 1A+1B).
Figure 1B:
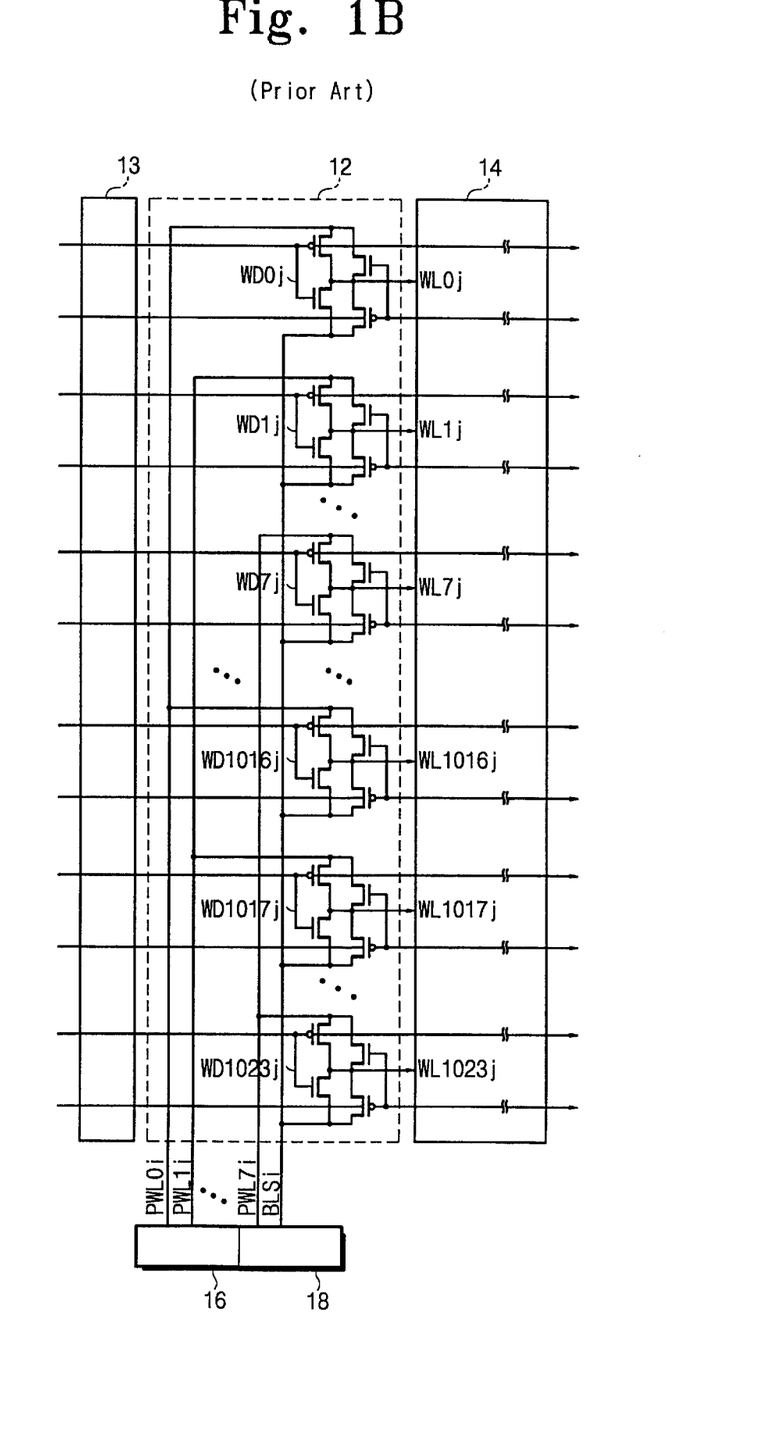

In FIG. 1, memory cell sectors 13 and 14 correspond to, for example, $i^{th}$ and $j^{th}$ sectors, respectively, with the total memory cell array divided into a plurality of sectors, each sector comprising 1024 word lines and 512 bit lines having 64(K) (k=1024) byte memory capacity (64(k) (b)ytes= 1024*512bits). In a read-out operation or a programmable operation, selection of a word line requires 10 address signals corresponding to 1024 word lines. One of 128 global word lines is selected by a global row decoder 10 and one of eight local word lines allocated to one global word line (128*8=1024) is selected by a local row decoder 15 or 16. The word line driver WD allocated to each word line, drives its associated word line in response to a global word line selection signal GWL supplied from the global row decoder 10, a local word line selection signal PWL supplied from the local row decoder 15 or 16, and a block selection signal BLS supplied from the block decoder 17 or 18. To supply a high voltage (a positive high voltage or a negative high voltage) to a word line in a read-out operation, a program operation or an erase operation, the global row decoder 10 and the local row decoder 15 or 16 are arranged with a level shifter LS for switching the high voltages.

Figure 2:
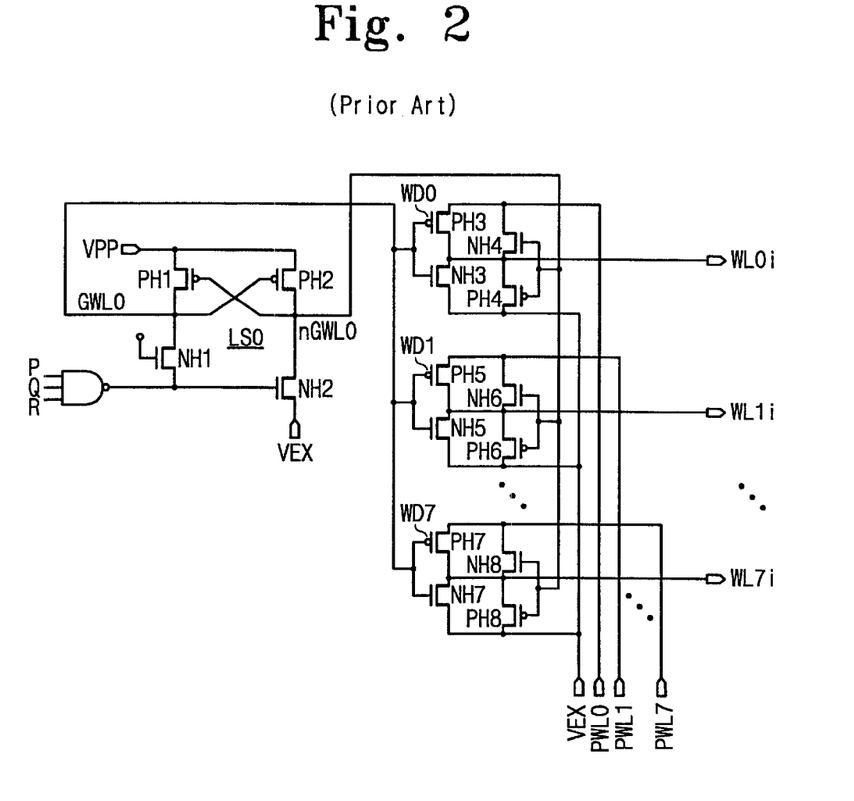
FIG. 2 is a schematic diagram illustrating the connection relation between the global row decoder and the word line driver in FIG. 1.
Figure 3:
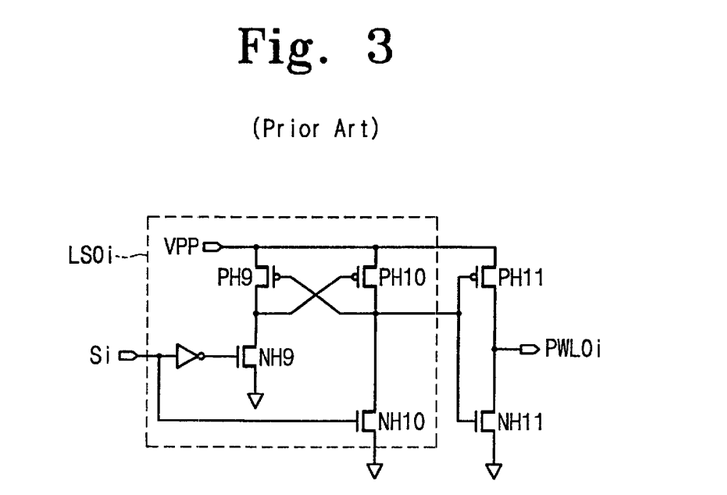
FIG. 3 is a schematic diagram of the local row decoder in FIG. 1.

FIG. 2 illustrates the connective relationship between the word line drivers WD0~WD7 and the LS0 that is one of 128 level shifters embedded in the global row decoder 10. FIG. 3 illustrates the structure of LS0$i$ that is one of eight level shifters embedded in the local decoder 15. In FIG. 2, the voltage terminal VPP represents a positive high voltage for a program operation and VEX represents a negative high voltage for an erase operation. As shown in FIG. 2 and FIG. 3, the high-voltage type PMOS transistors PH1~PH11 and the high-voltage type NMOS transistors NH1~NH11 are used to switch the high voltages.

The high-voltage type transistors are the transistors designed to perform the switching function without a physical burden such as a breakdown of an insulating film. Such transistors reinforce the enhancement characteristic of the MOS transistor even if a voltage higher than a voltage of the power supply may be applied to the drain or the source. In a read-out operation or a program operation, the positive high voltage VPP is switched to the corresponding word line, for example WL0$i$ through the high-voltage type PMOS transistors PH1, PH11, and PH3. In an erase operation, the negative high-voltage VEX is switched to the corresponding word line through the high voltage type NMOS transistors NH2 and NH4. The voltages applied according to the respective operation mode is listed in table 1 below:

TABLE 1

| Op. Mode | GWL | | Selected memory cell sector | | | | | Unselected memory cell sector | | |
|---|---|---|---|---|---|---|---|---|---|---|
| | Sel. GWL | Unsel. GWL | Sel. PWL | Unsel. PWL | Sel. PWL | Unsel. PWL | VEX | PWL | WL | VEX |
| Program | 9 V | 0 V | 9 V | 0 V | 9 V | 0 V | 0 V | 0 V | 0 V | 0 V |
| Erasure | | -9 V | | 0 V | | -9 V | -9 V | 0 V | 0 V | 0 V |
| Reaout | 4.5 V | 0 V | | 0 V | 4.5 V | 0 V | 0 V | 0 V | 0 V | 0 V |

In the structure of the decoder shown in FIG. 1, the high-voltage type PMOS transistors PH1~PH11 are made to share their N-type wells that are their bulk regions. That is, all the high-voltage type PMOS transistors relate to decoding are shaped in the one N-type well. Since the high voltage for the read-out or programmable operation is switched via the channel of such a high-voltage type PMOS transistors, the same high voltage is applied to the N-type well of their bulk regions to prevent the voltage drop via the PN junction. Subsequently, the boosting load increases significantly, because the N type well must be boosted, the well being shared from the high-voltage type PMOS transistors of the non-selected decoder regions as well as the high-voltage type PMOS transistors of the selected decoder regions, when the source voltage is being boosted to the high voltage in the read-out or program operation. In particular, the boosting load can be increased because the speed of the read-out operation can be faster only if the voltage of the word line must be boosted faster in the read-out operation. In accordance with a lower source voltage used in the flash memory device, the drop of the read-out operation speed will be increased more according to the increased boosting load.

During the program or erase operation, the burden of boosting the voltage in operation time can be relatively lower than that for the read-out operation, but it should be understood that the high-voltage type PMOS transistors will have their own non-necessary boosting load as long as the N type well, i.e., one bulk region is shared with the high-voltage type PMOS transistors.

Figure 4:
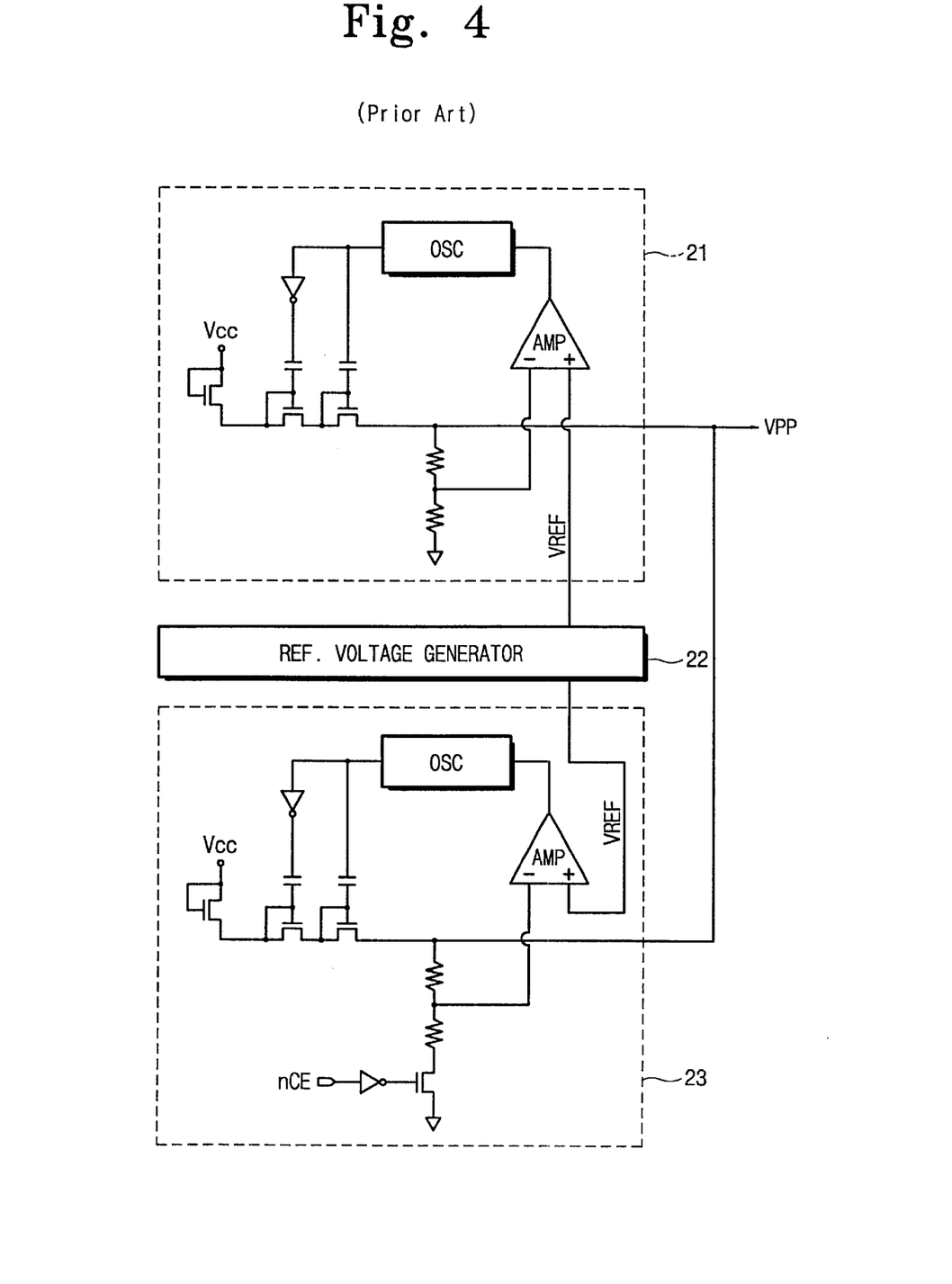
FIG. 4 is a schematic diagram for generating a high voltage used in FIG. 1.

In FIG. 4, the conventional circuits are illustrated for generating a high voltage to be supplied to the word line in the read-out operation or the program operation in the flash memory device used with the low source voltage. A small-capacity stand-by high-voltage generator which is activated directly when the flash memory device is powered on, and a large capacity high-voltage generator 23 which is activated when an address transition is detected or when an address transitions are used as shown in FIG. 4, to supply a high voltage VPP to be used in the global row decoder 10. Further, a reference voltage generating circuit 22 is provided for generating a reference voltage VREF applied to non-inverted stages of the comparing amplifiers AMP adapted with the stand-by and active high-voltage generators 21 and 23. However, it is disadvantageous that the capacity or performance of the active charge pump can be reduced and also it can be impossible to separately control the high voltages in the stand-by operation and the active operation. This is because the output terminal of the stand-by high-voltage generator 21 is inter-connected to that of the active high-voltage generator 23 in the high-voltage generating structure in FIG. 4.

SUMMARY OF THE INVENTION

Accordingly, it is an object of the present invention to provide a device by which the problem described above can be eliminated and the boosting load can be reduced in the flash memory using the low power voltage.

It is another object of the invention to provide a device for increasing the speed of the read-out operation in the flash memory using the low power voltage.

It is still another object of the invention to provide a device by which the boosting load can be reduced while in the read-out operation, the program operation, and the erase operation in the flash memory using the low power voltage.

It is further still another object of the invention to provide a device for efficiently generating and controlling a high voltage in the flash memory using a low source voltage.

In order to attain the above objects, according to an aspect of the present invention, there is provided a semiconductor memory device including: a plurality of memory cell sectors, each having a plurality of word lines and bit lines and a plurality of memory cells; a plurality of global word lines electrically connected to the word lines via connecting means; sector selection circuits for controlling the connecting means to select the memory cell sector; driver circuits for selectively supplying a voltage according to an operation mode to the global word line via a pull-up transistor therein; a partial row decoder for selectively enabling the voltage according to the operation mode to be supplied to the driver circuits; pre-charging circuits for causing the gate of the pull-up transistor in the driver circuits to be at a predetermined potential before the voltage according to the operation mode is applied to the global word line in response to a predetermined selection signal.

The pull-up transistor is a NMOS transistor for use in high voltages and the driver circuits each further comprise a pull-down transistor between the global word line and ground. The pre-charging circuit comprises a circuit for turning on the pull-down transistor before the voltage according to the operation mode is supplied into the global word line. The connecting means is a depletion transistor.

The pre-charging circuits are provided with a power supply at a first high voltage. The partial row decoder supplies the driver circuits with a second high voltage in a read-out operation mode and a third high voltage in a program operation mode. The first, second and third high voltages each is a potential higher than a voltage of the power supply of the semiconductor memory device and a circuit for generating the first high voltage is electrically insulated from a circuit for generating the second high voltage.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF THE PREFERRED EMBODIMENT

It should be understood that the description of this preferred embodiment is merely illustrative and that it should not be taken in a limiting sense. In the following detailed description, several specific details are set forth in order to provide a thorough understanding of the present invention. It will be obvious, however, to one skilled in the art that the present invention may be practiced without these specific details.

The preferred embodiments of the present invention will be now described with reference to the accompanying drawings in further detail below. The signal names starting from the "n" in reference numerals representing the signals recited in the description and drawings of the present invention refer to low-active signals. The storage capacity of the flash memory and the number of associative word lines adapted to the embodiment of the present invention also are not limited to the described features but are provided by way of examples. The present invention also is adapted to a low power flash memory device in which the voltage of word lines must be boosted, for example, normally to read out the data, etc.

Figure 5:
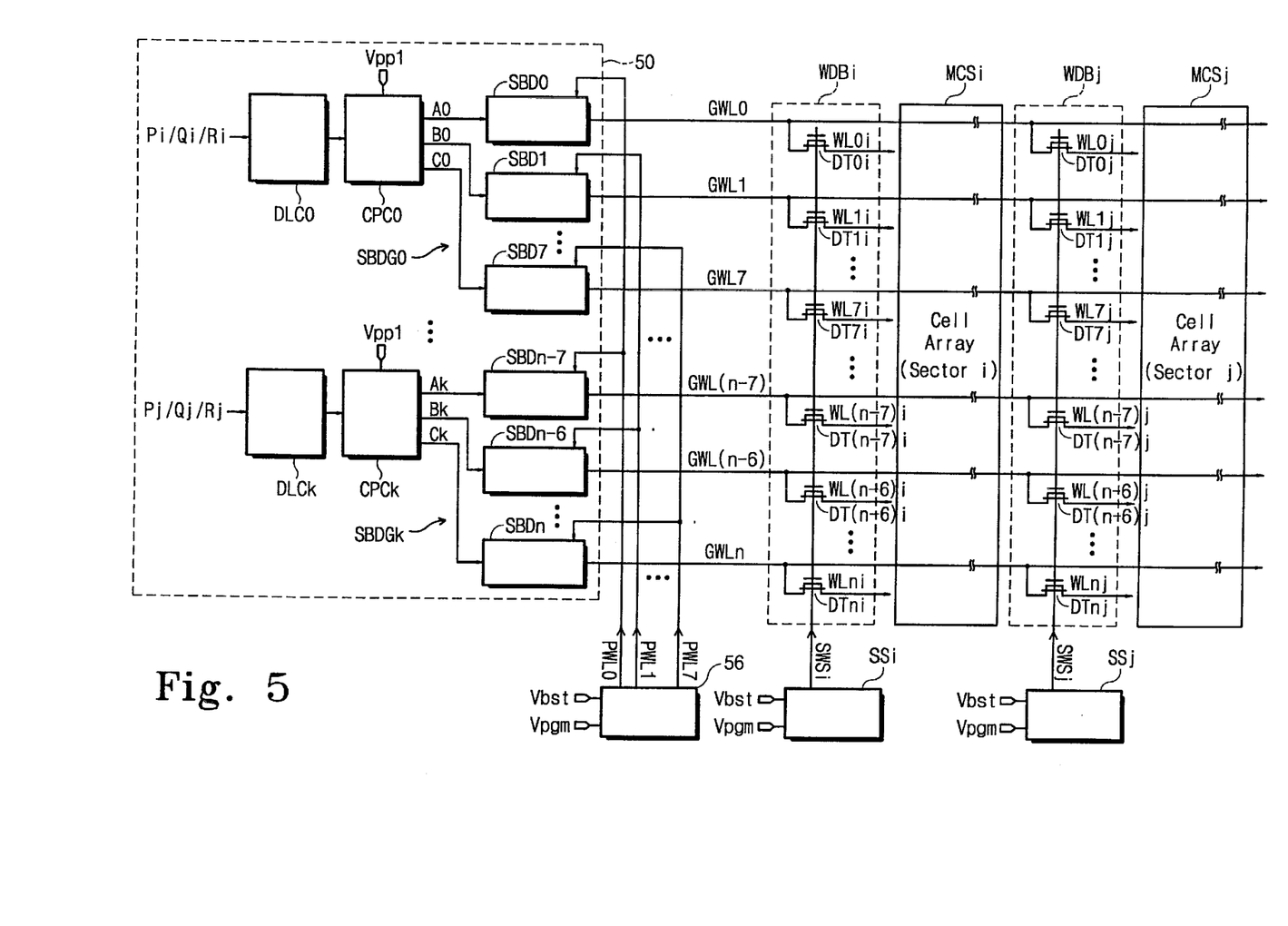
FIG. 5 is a schematic diagram illustrating a structure driving the word lines according to the embodiment of the present invention.

FIG. 5 illustrates the connective relationship between the decoding circuits and the memory cell array designed according to the present invention. The memory cell arrays MCSi and MSCj shown in FIG. 5 correspond to the $i^{th}$ and $j^{th}$ cell sectors, respectively, with the total memory cell array divided into a plurality of sectors, each cell sector comprising, for example, 1024 word lines WL0~WLn (n=1023) and 512 bit lines having the storage capacity of 64K byte (1024*512/bits/8 bits/byte=64(K) byte). The 1024 word lines WL0~WLn arranged in each memory cell sector are connected to 1024 global word lines GWL0–GWLn (n=1023) transistors DT0~DTn (n=1023). A character, "i" or appended at the end of a reference numeral represents the ordinal numeral of the memory cell sector in which it is included. Thus, the ith and jth word line driving transistors DT0$i$~Dtni and DT0$j$~DTnj are, respectively, included in the word line driving blocks WDBi and WDBj, which are responsible for the memory cell sectors MCSi and MCSj, respectively. Further, the word line driving transistors DT0–DTn comprises depletion NMOS transistor, respectively, to whose gates a sector selection signal SWSi (or SWSj) supplied by a sector selection circuit SSi (or SSj) is commonly applied.

The sector selection circuits SSi and SSj control the word line driving transistors DT0$i$~DTni and DT0$j$~DTnj in the memory cell sector, respectively to select the memory cell sectors MCSi and MCSj. The second high-voltage Vbst and the third high-voltage Vpgm are applied to a partial row decoder 56 and the sector selection circuits SSi and SSj.

A global word lines decoding block 50 comprises self-boosting drivers SBD0~SBDn (n=1023) whose number corresponds to the number of global word lines driving the global word lines GWL0~GWLn. The self-boosting drivers SBD0~SBDn are classified into 128 groups SBDG0~SBDGk (k=127) each group comprising eight self-boosting drivers. Eight partial word line driving signals PWL0~PWL7 supplied from the partial row decoder 56 are, respectively, input to the eight self-boosting drivers (SBD0~SBD7, ..., or SBDn-7~SBDn; n=1023) included in the 128 groups SBDG0~SBDGk. Also, associative channel pre-charging signals A0~C0, ..., Ak~Ck supplied from each of 128 channel pre-charging circuits CPC0~CPCk are, respectively, input to the corresponding eight self-boosting drivers (SBD0~SBD7, or SBDn-7~SBDn; n=1023) included in the 128 self-boosting drive groups SBDG0~SBDGk.

Decoding logic signals supplied from decoding logic circuits DLC0~DLCk are input to associative channel pre-charging circuits CPC0~CPCk, respectively. Additionally, the channel pre-charging circuits CPC0~CPCk employ as the voltage of a power supply the first high voltage to be activated in a stand-by operation. Pre-decoding signals Pi, Qi, and Ri supplied from the corresponding pre-decoders are input to the decoding logic circuits DLC0~DLCk.

The circuit group—from the decoding logic circuit DLC0 for inputting the pre-decoding signals Pi, Qi and Ri via the channel pre-charging circuit CPC0 to self-boosting driver group SBDG0—may be referred to as a global row decoding unit. One hundred twenty-eight such global row decoding units are described in the present embodiment in FIG. 5. The $128^{th}$ global row decoding unit corresponds to the circuit group from the decoding logic circuit DLCk (k=127) for inputting the pre-decoding signals Pj, Qi and Rj via the channel pre-charging circuit CPCk to the self-boosting driver group SBDGk. Since eight global word lines are allocated to each of the global row decoding units, selection of any one of all 1024 global word lines requires ten address bits. Seven of the ten address bits are allocated to select one of 128 global row decoding units and the remaining three of the ten address bits are allocated to select one of eight global word lines included in one global row decoding unit.

Figure 6:
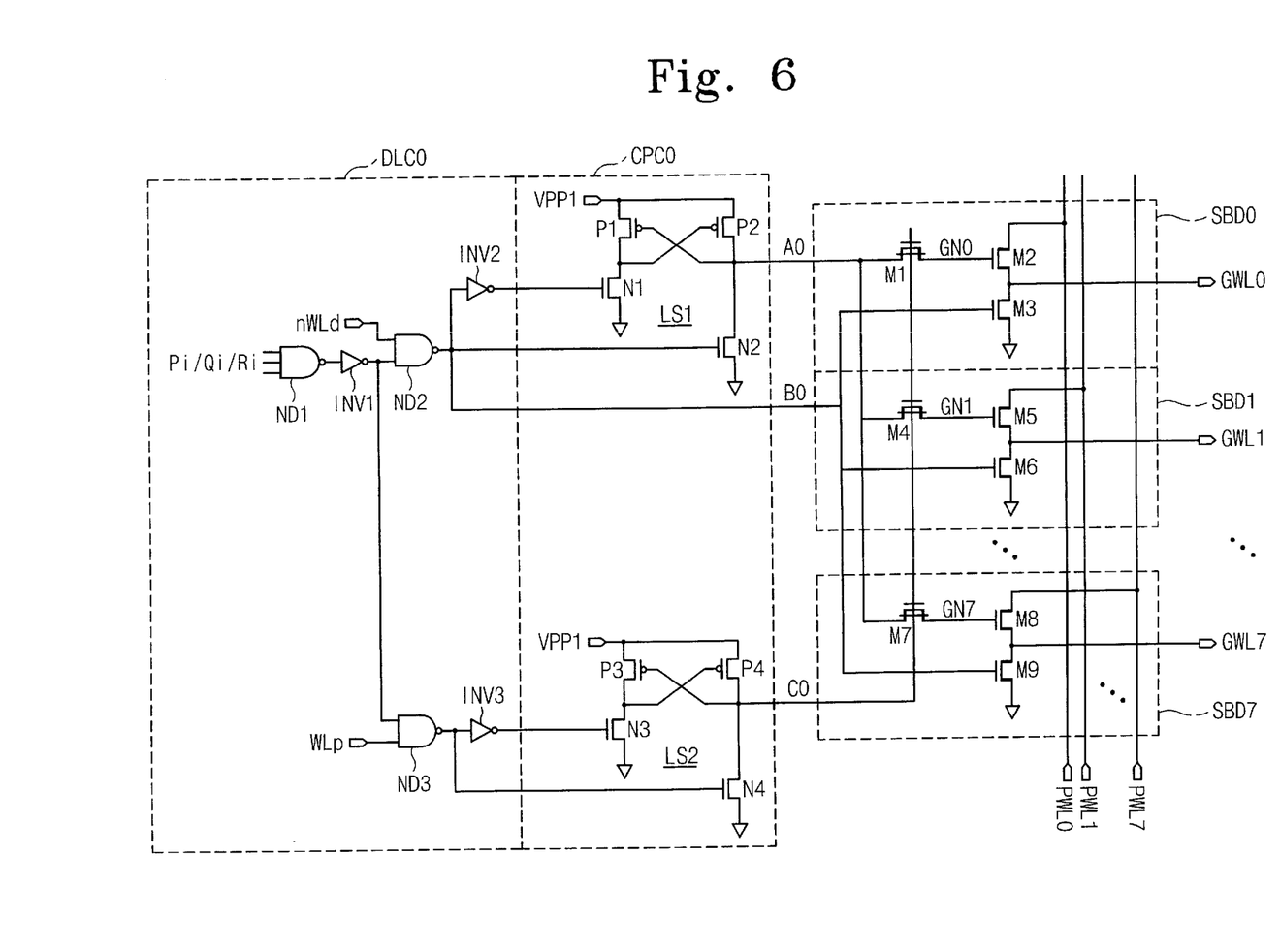
FIG. 6 is a schematic diagram illustrating the connection relation between the global row decoding block and the word line driver in the FIG. 5.

FIG. 6 illustrates in detail a structure of one global row decoding unit (DLC0+CPC0+SBD0~SBD7) shown in FIG. 1. Decoding logic circuit DLC0 comprises a NAND gate ND1 for inputting pre-decoding signals Pi, Qi and Ri , a NAND gate ND2 for inputting an output of the NAND gate ND1 via an inverter INV1 and a word line discharging signal nWLd, and a NAND gate ND3 for inputting an output of the inverter INV1 and a word line WLp. The channel precharging circuit CPC0 comprises two level shifters LS1 and LS2 having a first high-voltage VPP1 as a voltage of a power supply. The level shifter LS1 (or LS2) refers to a normal level shifter comprising PMOS transistors P1 and P2 (or P3 and P4) and NMOS transistors N1 and N2 (or N3 and N4). The output of the NAND gate ND2 is applied to the gate of the NMOS transistor N1 via an inverter INV2 and also to the gate of the NMOS transistor N2 directly. The output of the NAND gate ND3 is applied to the gate of the NMOS transistor N3 via an inverter INV3 and also to the gate of the NMOS transistor N4 directly.

The self-boosting drivers SBD0~SBD7 comprise a high-voltage depletion NMOS transistor M1, M4 or M7, a high-voltage NMOS transistor M2, M5 or M8 and a high-voltage NMOS transistor M3, M6 or M9, respectively. The high voltage depletion transistor M1 is connected between an output A0 of the level shifter LS1 and a gate of the high-voltage NMOS transistor M2. The gate of the high-voltage depletion transistor M1 is connected to an output C0 of the level shifter LS2. The high-voltage NMOS transistor M2 is connected between a partial word line driving signal PWL0 and a global word line GWL0.

In the first self-boosting driver SBD0, the high-voltage NMOS transistor M3 to whose gate an output B0 of the NAND gate ND2 is applied, is connected between the global word line GWL0 and a ground. The output BO of the NAND gate ND2 is commonly applied to the gates of the high-voltage NMOS transistors, for example, M3, M6 and M9 included in the corresponding self-boosting drivers SBD0~SBD7.

In the second self-boosting driver SBD1, the high-voltage NMOS depletion transistor M4 is connected between the output A0 of the level shifter LS1 and a gate of the high-voltage NMOS transistor M5. The high-voltage NMOS transistor M5 is connected between a partial word lines driving signal PWL1 and a global word line GWL1, and a high-voltage NMOS transistor M6 is connected between the global word line GWL1 and a ground.

Lastly in the eighth self-boosting driver SBD7, the high-voltage NMOS depletion transistor M7 is connected between the output A0 of the level shifter LS1 and a gate of a high-voltage NMOS transistor M8. The high-voltage NMOS transistor M8 is connected between a partial word lines driving signal PWL7 and a global word line GWL7, and a high-voltage NMOS transistor M9 is connected between the global word line GWL7 and a ground. Also, the gates of the high-voltage depletion NMOS transistors M1, M4 and M7 are commonly connected to the output C0 of the level shifter LS2.

The first high voltage VPP 1 is generated when the flash memory device is powered up, and has a potential of about 4.5V. VPP1 is used to supply the voltage to the gates of the high-voltage NMOS transistors constituting the self-boosting drivers.

Figure 7:
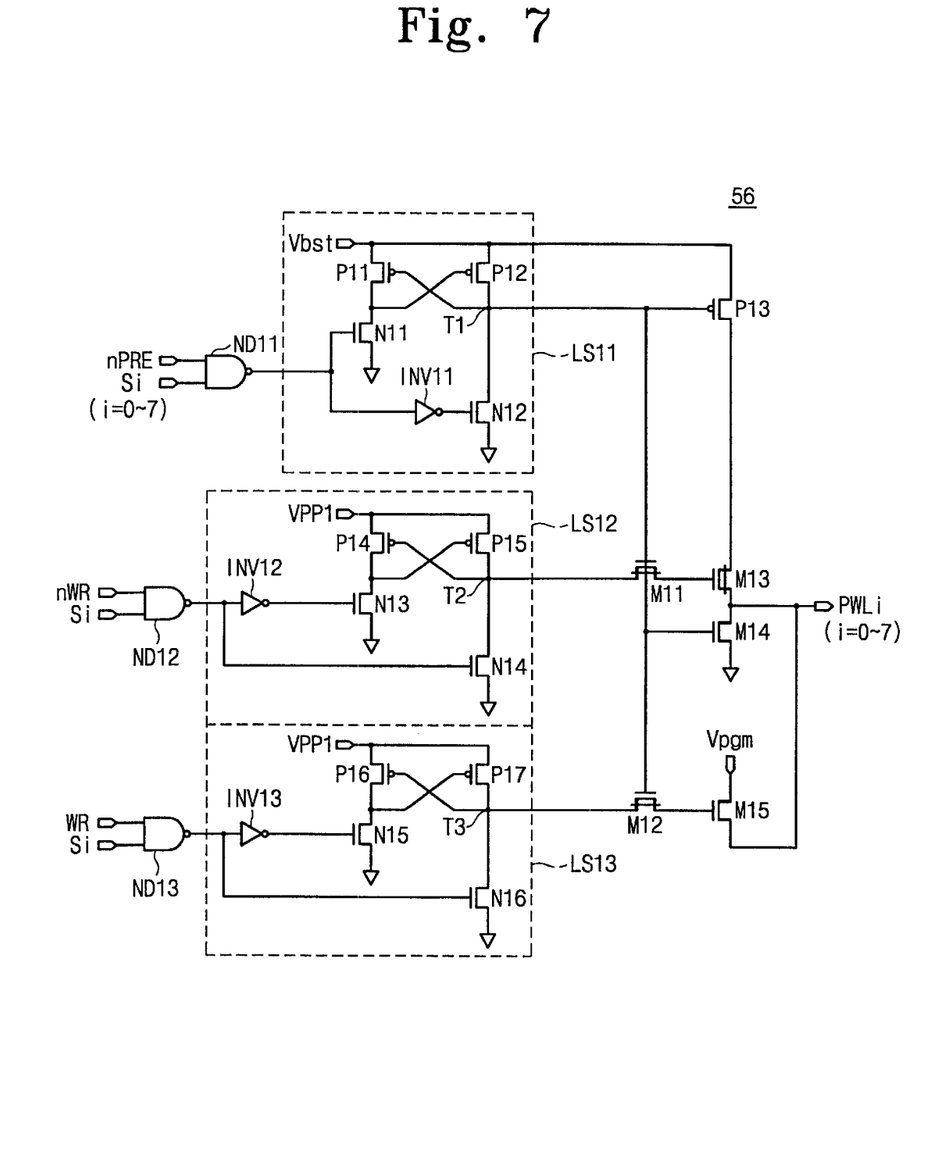
FIG. 7 is a schematic diagram of the partial row decoder in FIG. 5.

FIG. 7 illustrates the detailed structure of the partial row decoder 56 shown in FIG. 5. The partial row decoder circuits in FIG. 7 are provided as many as the number of the partial word line driving signals, PWL0~PWL7 (that is, eight partial row decoder circuits), and each comprises three level shifters LS11, LS12 and LS13. The level shifter LS11 uses the second high voltage Vbst of about 4.5V as a power source and the level shifters LS12 and LS13 use in common the first high voltage VPP1 as a power source.

The output of the NAND gate ND11 to which a pre-charging signal nPRE and an address decoding signal Si (I=0, 1, . . . 7) are input, is applied to the gate of the NMOS transistor N11 included in the level shifter LS11. The output of the NAND gate ND11 also is applied to the gate of the NMOS transistor N12 in the level shifter LS11 via an inverter INV11. The output of the NAND gate ND12 to which a write-in signal nWR and an address decoding signal Si are input, is applied to the gate of the NMOS transistor N13 in the level shifter LS12 via an inverter INV12. The output of the NAND gate ND12 also is applied directly to the gate of the NMOS transistor N14 in the level shifter LS12. The output of the NAND gate ND13 to which a write-in signal WR and an address decoding signal Si are input, is applied to the gate of the NMOS transistor N15 in the level shifter LS13 via an inverter INV13. The output of the NAND gate ND13 also is applied to the gate of a NMOS transistor N16 in the level shifter LS13.

The output terminal T1 in the level shifter LS11 is connected to the gate of the PMOS transistor P13 as well as to the gates of the NMOS transistors M11, M12, and M14. The output terminal T2 in the level shifter LS12 is connected to the gate of the high voltage depletion NMOS transistor M13 via a high-voltage depletion NMOS transistor M11. The output terminal T3 of the level shifter LS13 is connected to the gate of a high voltage NMOS transistor M15 via a high voltage depletion NMOS transistor M12.

The high-voltage NMOS transistor M15 is connected between a third high voltage Vpgm and a partial word line driving signal output PWLi (i=0, 1, . . . 7).). The output terminal T1 in the level shifter LS11 is connected in common to the gates of the high-voltage depletion NMOS transistors M11 and M12. The high-voltage depletion NMOS transistor M13 is connected between the PMOS transistor P13 and the partial word line driving signal output PWLi. The high-voltage NMOS transistor M14 is connected between the partial word line driving signal output PWLi and a ground, and the gate of the NMOS transistor M14 is connected to the output terminal T1 of the level shifter LS11.

Description with respect to the generation of the first, second and third high voltages will be made in detail below in conjunction with a high voltage generating circuit in FIG. 9.

Figure 8:
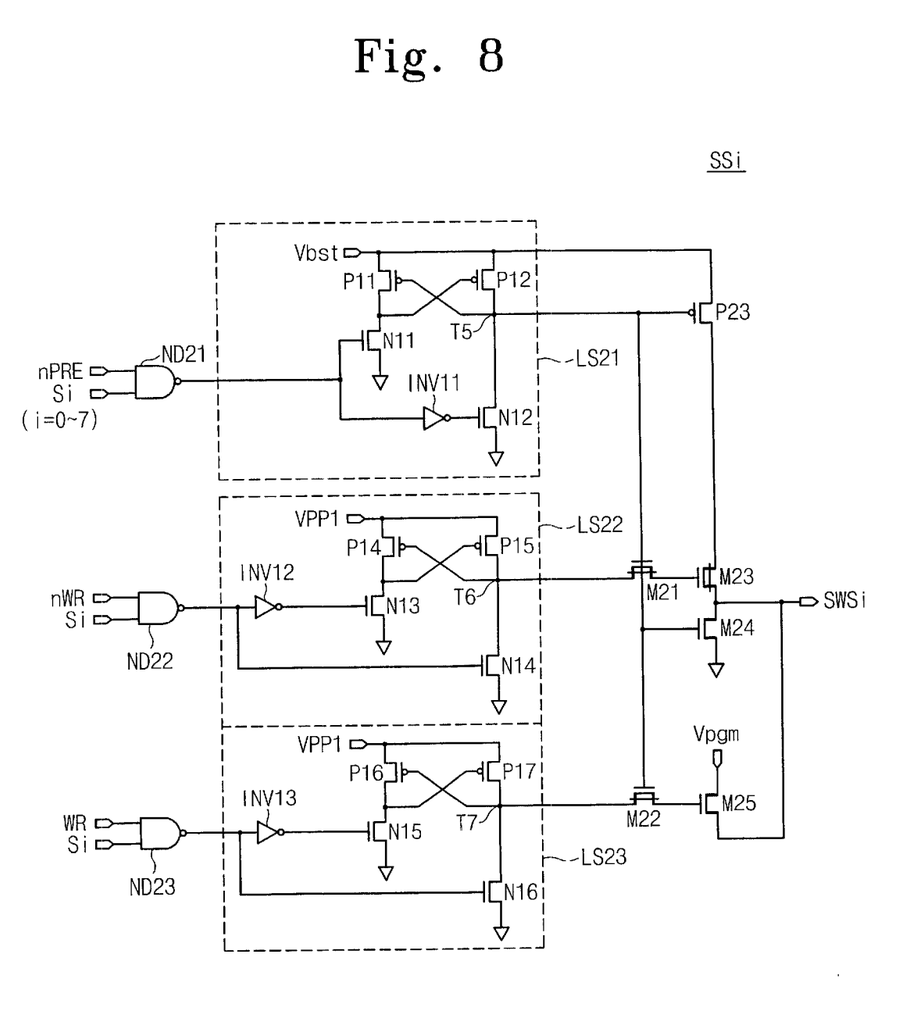
FIG. 8 is a schematic diagram illustrating a part of the sector selection circuit in FIG. 5.

FIG. 8 illustrates a detailed structure of the sector selection circuits SSi and SSj in FIG. 5, which is similar with the structure of the partial row decoder 56 described above except for the kind of signals that are input to the level shifters. That is, the sector selection circuit in FIG. 8 comprises 3 level shifters LS21, LS22 and LS23 to generate the sector selection signal SWSi for selecting a memory cell sector MCSi. The level shifter LS21 uses the second high-voltage Vbst as a power source and the level shifters LS22 and LS23 use the first high voltage VPP1 as a power source. The input of the level shifter LS21 is the output of the NAND gate ND21 to which a pre-charging signal nPRE and an address decoding signal Si (the address decoding signal for selecting the ith memory cell sector) are input. The output of the NAND gate ND22 is input to the level shifter LS22 to which a write-in signal nWR and an address decoding signal SAi are input. The output of the NAND gate ND23 to which a program signal PGM and an address decoding signal SAi are input, is input to the level shifter LS23.

The output terminal T5 of the level shifter LS21 is connected to the gate of the PMOS transistor P23 and to the gates of the NMOS transistors M21, M22, and M24. The drains of PMOS transistors P11, P12, and P23 are connected to the second high voltage Vbst. The output terminal T6 of the level shifter LS22 is connected to the gate of the high-voltage depletion NMOS transistor M23 via the high-voltage depletion NMOS transistor M21. The output terminal T7 of the level shifter LS23 is connected to the gate of the high-voltage NMOS transistor M25 via the high-voltage depletion NMOS transistor M22. The high-voltage NMOS transistor M25 is connected between the third high voltage Vpgm of about 9V and a sector selection signal output SWSi. The output terminal T5 of the level shifter LS21 is connected in common to the gates of the high-voltage depletion NMOS transistors M21 and M22. The high-voltage depletion NMOS transistor M23 is connected between the PMOS transistor P23 and a sector selection signal output SWSi. The high-voltage NMOS transistor M24 whose gate is connected to the output terminal T5 of the level shifter LS21 is connected between the sector selection signal output SWSi and a ground.

The high-voltage NMOS transistors are used for the output terminals in the partial row decoder 56 in FIG. 7 or the sector selection circuit SS in FIG. 8 since the word lines must be applied with a voltage higher than the voltage of a power source on read-out or programming operation. Also, the depletion type pull-up transistors are used in order to reject a voltage drop by a threshold voltage.

Figure 9:
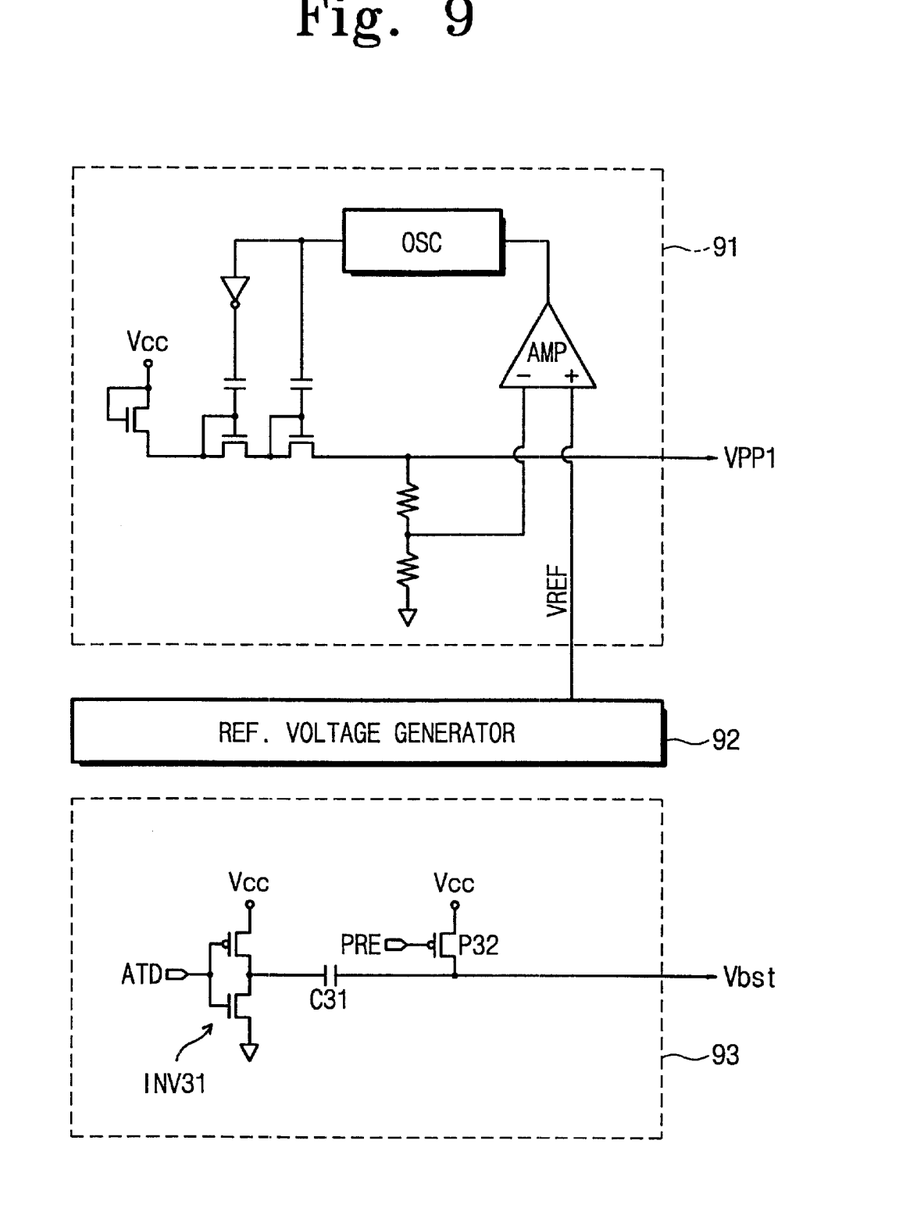
FIG. 9 is a schematic diagram illustrating a generation of a high voltage used in FIGS. 5, 6, 7, and 8.

Referring to FIG. 9, the high-voltage generating circuit according to the present invention comprises a charge pump 91 having small capacity for stand-by operation, a reference voltage generating circuit 92, and an active kicker 93 having large capacity. The charge pump 91 for generating the first high voltage VPP1 for stand-by operation has the same constitution as that of the conventional charge pump 21 in FIG. 4. However, during a normal operation, for example, a read-out or program operation, a reference voltage VREF from the reference voltage generating circuit 92 is not applied to the active kicker 93 for generating the second high voltage Vbst to be supplied to the word lines, and, further, the active kicker 93 is electrically insulated from the charge pump 91 for stand-by operation.

The active kicker 93 comprises an inverter INV31 to which an address transition detection signal ATD is applied, a capacitor C31 connected between an output node of the inverter INV31 and a Vbst, and a PMOS transistor P32, which is connected between a voltage of a power source Vcc and a Vbst and whose gate is connected to the pre-charging signal PRE.

As described above, the first high voltage VPP1 is a voltage to be used for self-boosting the row decoder (the global row decoder, the partial row decoder, or the sector selection circuit) and has relatively high parasitic capacitance but relatively low current dissipation. The second high voltage Vbst that is supplied to the word line is a voltage node has higher current dissipation than that of the charge pump 91 and a lower self-boosting load than that of the charge pump 91.

The present invention is characterized in that the semiconductor memory device is adapted to a self-boosting manner in order to reduce a self-boosting load in accordance with the transmission of the word line voltage necessary to read out or program operations simply via the high-voltage NMOS transistor.

During a read-out or programming operation, it is assumed that the global word line GWL0 and the word line WL0i have been selected and the memory cell sector MCSi has been selected. First, the output B0 of the NAND gate ND2 becomes high as the word line discharging signal nWLd goes to a low level and thus is activated to discharge the global word lines GWL0~GWL7 before the operation in the global row decoder 50 of FIG. 6. Then, the output A0 of the level shifter LS1 of the channel pre-charging circuit CPC0 becomes a low level. While B0 is high (during a period Tw1d), the NMOS transistors M3, M6, and M9 (referred to as "word line discharging pull-down transistors" below) of the self-boosting drivers SBD0~SBD7 will be turned on so that charges on the global word line GWL0~GWL7 will be discharged into a ground. The NMOS transistors M2, M5 and M8 are not turned on since A0 in a low level has been applied to the gate of the NMOS transistors M2, M5 and M8 (referred to as "the word line pull-up transistors" below) connected to the partial word line driving signal PWL0~PWL7.

As the word line discharging signal nWLd becomes inactivated, B0 goes to a low level and the pull-down transistors M3, M6 and M9 are turned on so that the operation of the global word lines can be completed. After the discharging of the global word lines GWL0–GWL7 has been completed, the output B0 of the NAND gate ND2 is switched to a low level. Then, the NMOS transistor N1 and PMOS transistor P2 of the level shifter LS1 is turned on so that the output A0 will be charged with the first high voltage VPP 1. As all the inputs of the NAND gate ND3— comprising the word line pre-charging signal WLp to be activated by a short pulse of a high level are high and the NMOS transistor N3 and PMOS transistor P4 of the level shifter LS2 is turned on, the output C0 of the level shifter LS2 is charged up to the first high voltage VPP1. Then the output A0 charged up to a VPP1 level is applied to the gates of the NMOS pull-up transistors M2, M5 and M8 via the depletion NMOS transistors M1, M4 and M7. After the gates of the NMOS pull-up transistors M2, 45 and M8 are pre-charged up to the level of the first high-voltage VPP1, C0 goes from VPP1 to 0V so that the gates of the pull-up transistors are maintained at the pre-charging level of VPP1. After the pre-charging operation has been completed, the PWL0 from the partial row decoder 55 in FIG. 7 is activated to apply the voltage to the drain of the NMOS pull-down transistor M2 to drive the selected GWL0 of the eight global word lines.

A process for activating and generating the partial word line driving signal PWL0 corresponding to the selected global word line GWL0 will now be described. Before the partial word line driving signal PWL0 is generated at the level of the second high-voltage Vbst for a read-out operation or at the level of the third high voltage Vpgm for a program operation, the pre-charging signal nPRE is used to discharge the partial word line driving signal output terminal PWL0 and to pre-charge the gates of the transistors in its path. A pre-charging process is performed, as necessary, to transmit the high voltage from the global decoder without a voltage drop. That is, if nPRE is activated in a low level, the output of the NAND gate ND11 becomes high and thus the output T1 of the level shifter LS11 becomes high.

Since T1 is applied to the gate of the high-voltage NMOS depletion transistors M11 and M12 and the gate of the high voltage NMOS transistor M14, the gates of the NMOS depletion transistors M11 and M12 will be charged up to the second high-voltage Vbst and the partial word line driving signal output terminal PWLi will be discharged to 0V via the NMOS transistor M14. Then, if the pre-charging signal nPRE is inactivated at high, the output of the NAND gate ND11 becomes low and T1 goes to a low level by the selected signal S0 to be activated at a high level The drain of the high voltage depletion NMOS transistor M13 is charged up to the second high voltage Vbst via the PMOS transistor P13 turned on by T1 at a low level.

A write-in control signal WR (or nWR) is a signal that can be activated to a high level (a low level in the case of nWR) on a programming operation and that can be inactivated to a low level (a high level in the case of nWR) on a read-out operation. Therefore, the output T3 of the level shifter LS13 is increased up to a high level in the programming operation and then the gate of the high-voltage NMOS transistor M15 can be charged up to the level of the first high-voltage VPP1. The programmable voltage Vpgm of about 9V that is the third high voltage is supplied as a power source of the partial word lines driving signal PWL0 via the NMOS transistor M15. At this time, because nWR is in a low level, the output T2 of the level shifter LS12 is low and the depletion NMOS transistor M13 is turned off so that Vbst used on a read-out operation is not sent to PWL0. On the contrary, when a write-in control signal WR is in a low level (a high level in the case of the nWR), that is, on a read-out operation, T2 is in a high level and T3 is in a low level so that Vbst that is a power source for a read-out operation is supplied to PWL0 via the depletion NMOS transistor M13.

The drains of the high-voltage depletion NMOS transistor M13 and NMOS transistor M15 used for a pull-up operation in the read-out or program operation modes are powered by a second high voltage Vbst for a read-out operation and a third high voltage Vpgm for a program operation, respectively. Accordingly, if a voltage VPP1 is applied to the gates of the high voltage depletion NMOS transistor M13 and NMOS transistor M15, then the self-boosting occurs naturally by the parasitic capacitance existing between the drains and the gates of the high voltage depletion NMOS transistor M13 and NMOS transistor M15, respectively. Thus, Vbst or Vpgm is supplied to PWL0 without a voltage drop because the gates of the depletion NMOS transistor M13 or NMOS transistor M15 have been driven in response to the second high voltage Vbst or the third high voltage Vpgm that are both higher than the first high voltage VPP1.

Figure 10:
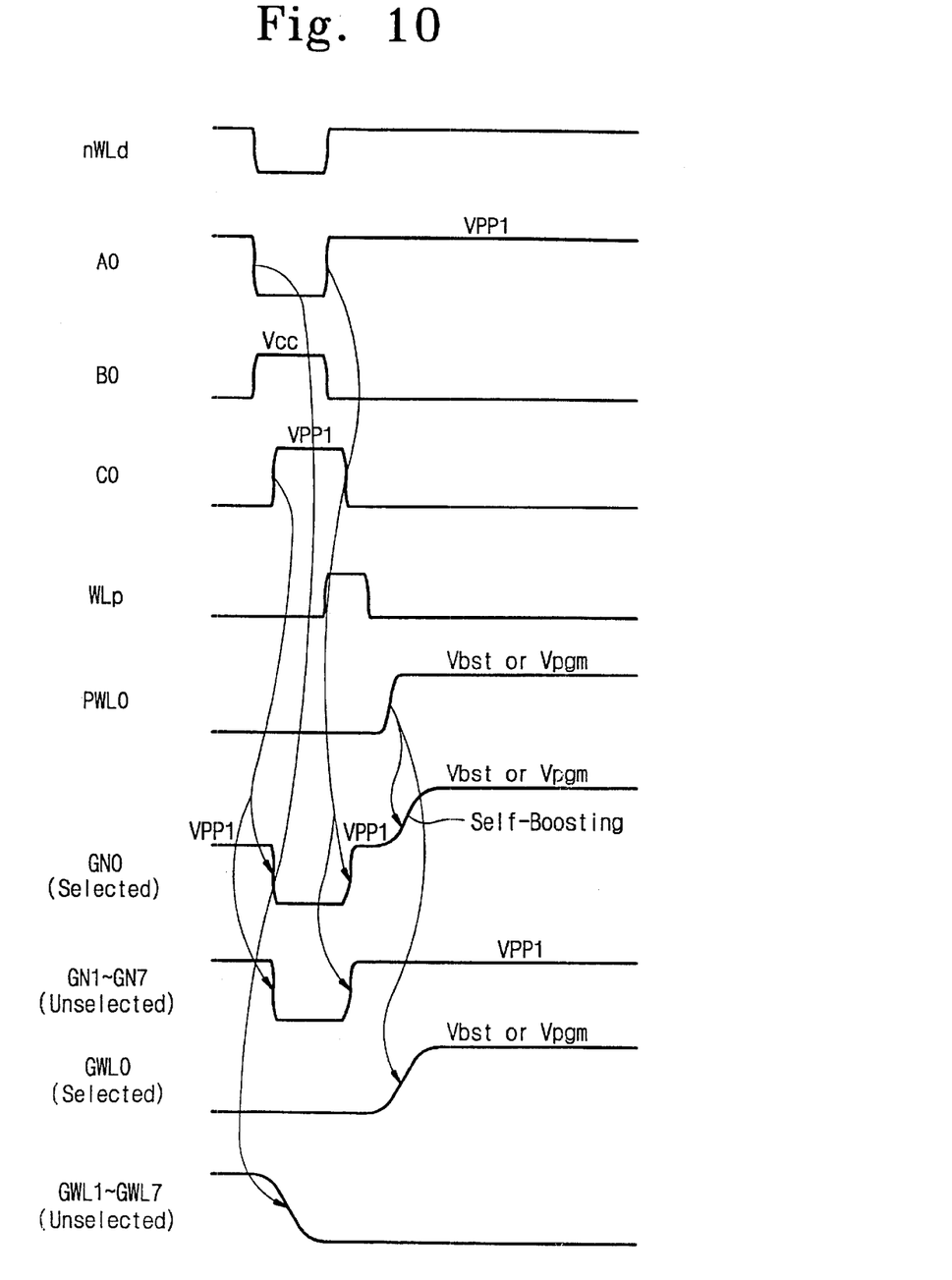
FIG. 10 is a voltage waveform diagram illustrating the relation between the various signals of FIGS. 5–9.

Referring back to FIG. 6, PWL0 that is at a level of the Vbst (for a read-out operation) or Vpgm (for a programming operation) is generated by a partial row decoder 56 of FIG. 5 and applied to the drain of the NMOS pull-up transistor M2. The self-boosting progresses according to the capacitive coupling between the gate and the drain in response to Vbst or Vpgm applied to the drain, because the gate node GN0 of the NMOS transistor M2 has been already pre-charged up to a level of VPP1. Consequently, as can be seen in FIG. 10, the gate node GN0 is increased from VPP1 to a level of Vbst or Vpgm, and Vbst or Vpgm is sent to the selected global word line GWL0 via the NMOS transistor M2 without any voltage drop. The gate nodes GN1–GN7 of the other, unselected pull-up transistors M5 and M8 remain at their previous pre-charging level VPP1 and the other, unselected global word lines GWL1~GWL7 remain at their previous discharged state, i.e. 0V.

Referring briefly back to FIG. 5, the selected global word line GWL0, at a level of the Vbst or Vpgm, is applied to the drain of the driving transistor DT0$i$ included in the ith word line block WDBi.

A process for generating the sector selection signal SWSi applied to the gate of the depletion-type drive transistor DT0$i$ will be discussed with reference to FIG. 8 below. With reference to a pre-charging signal nPRE used in the sector selection circuit SS in FIG. 8, a charging operation of the gate of the high-voltage NMOS depletion transistors M21 and M22, and a discharging operation of the sector selection signal output terminal SWSi by the high-voltage NMOS transistor M24, will be performed at the same manner as the operations performed in the partial row decoder in FIG. 7. That is, as NPRE is activated in a low level, the output T5 of the level shifter LS21 becomes in a high level and the sector selection signal output terminal SWSi is discharged to 0V by turning the transistor M24 on. When the write-in control signal WR (a programming control signal) is in a low level (a high level in the case of the nWR), i.e. in a read-out operation, the second-high voltage Vbst is applied as a power source of SWSi via the high-voltage NMOS depletion transistor M23. Whereas, when WR is in a high level, that is, in a program operation, the third high voltage Vpgm is applied as a power source of the SWSi via the high voltage NMOS transistor M25 in order to supply the SWSi to the gate of the drive transistor DT0$i$ according to Vbst or Vpgm, i.e. the word lines driving voltage applied to the drain of the drive transistor DT0$i$ in FIG. 5 on a read-out or program operation.

The voltage necessary for a read-out or programming operation is finally applied to the selected word line WL0$i$ without the voltage drop, because the drive transistor is formed in depletion type and the voltage is applied that is equal to the voltage level to be transmitted to the gate of the drive transistor DT0$i$ that supplies the drive voltage (Vbst for a read-out operation or Vpgm for a program operation) to the word line WL0$i$ by connecting the selected global word line GWL0 and the selected word line WL0$i$.

For more clear comprehension of the operation, Tables 2–4 below show the levels of the voltages applied in program, erase and read-out operation modes according to the present invention described above. Table 2 lists voltage states applied to the selected memory cell and Table 3 represents levels of the first, second and third high voltage according to the operation modes. Table 4 also illustrates the voltage levels of the word lines and the selected signals according to the operation modes.

TABLE 2

| Op. Mode | Word lines | Bit lines | Source lines | Bulk |
|---|---|---|---|---|
| Program | +9V | 5V | 0V | 0V |
| Erasure | 0V | Floating | Floating | '18V |
| Read-out | +4.5V | +1V | 0V | 0V |

TABLE 3

| Op. Mode | VPP1 | Vbst | Vpgm | Selected GWL | Unselected GWL |
|---|---|---|---|---|---|
| Program | 4.5V | Vcc | 9V | 9V | 0V |
| Erasure | 4.5V | Vcc | Vcc | | 0V |
| Read-ou | 4.5V | 4.5V | Vcc | 4.5V | 0V |

TABLE 4

| Op. Mode | GWL Sel | GWL Unsel. | Selected memory cell sector Sel. PWL | Unsel. PWL | SWSi | Sel. WL | Unsl. WL | Bulk | Unselected memory cell sector PWL | SWSi | WL of Unsel. GWL | bulk |
|---|---|---|---|---|---|---|---|---|---|---|---|---|
| Program | 9 V | 0 V | 9 V | 0 V | 9 V | 0 V | | 0 V | 0 V | | Vth of DT | 0 V |
| Erasure | 0 V | | | 0 V | | | | 18 V | | 0 V | | |
| Read-out | 4.5 V | 0 V | 4.5 V | 0 V | 4.5 V | | | 0 V | 0 V | | Vth of DT | 0 V |

As can be seen in Table 2, the positive high voltage that is 18V is applied to the bulk region only in an erasable operation in the embodiment of the present invention. This contrasts with a manner in which the positive high voltage is applied to the bulk region and the negative high voltage is applied to the word lines in an erasable operation, in accordance with the prior art. Although the voltage levels used with the present invention are not different from the those of the conventional art when in a program or read-out operation, because the present invention employs the self-boosting method discussed above in the present embodiment distinctly different from the way used in a prior art, it should be noted that the PMOS transistors are not used as a pull-up transistors and the high voltage is not applied to the bulk region of the PMOS transistors to supply the high voltage to the word lines.

It will be apparent to those skilled in the art that various modifications, additions and substitutions are possible in circuit structures of self-boosting drivers, partial row decoders, sector selection circuits and word line driver blocks introduced above without departing from the scope and spirit of the invention as described in the accompanying claims.

The decoding circuits of the present invention has no loading burden for boosting a voltage up to a bulk region, because a high voltage necessary to a read-out or programming operation is applied to the selected word lines via a self-boosting method. Such is not accomplished in the present invention by using PMOS transistors as pull-up transistors, instead high-voltage NMOS transistors and depletion transistors are used according to the present invention. Furthermore, because the gate voltage is increased according to the supplied voltage, the supplied high voltage is sent to the word lines without the voltage drop in read-out and program operations. This represents another distinctive advantage over the prior art.

Numerous modifications and variations of the present invention are possible in light of the above teachings. It is therefore to be understood that, within the scope of the appended claims, the present invention can be practiced in a manner other than as specifically described herein.

What is claimed is:

1. A semiconductor memory device having electrically erasable and programmable memory cells, comprising:
   a plurality of memory cell sectors each having a plurality of word lines, a plurality of bit lines, and a plurality of memory cells;
   a plurality of global word lines each electrically connected to at least one of the word lines via connecting means;
   a plurality of sector selection circuits that select a memory cell sector by controlling the connecting means;
   a plurality of driver circuits that selectively supply a voltage according to an operation mode to a selected global word line via a pull-up transistor therein;
   a partial row decoder that selectively enables the voltage according to the operation mode and supplies it to the driver circuits; and
   a plurality of pre-charging circuits that cause a gate of a pull-up transistor in each driver circuit to be at a predetermined potential before the voltage according to the operation mode is applied to the selected global word line in response to a predetermined selection signal.

2. The semiconductor memory device as recited in claim 1, wherein the pull-up transistor is a NMOS transistor for use with high voltages.

3. The semiconductor memory device as recited in claim 1, wherein the driver circuits further comprise a pull-down transistor coupled between one of the global word lines and ground.

4. The semiconductor memory device as recited in claim 3, wherein the pre-charging circuits each comprise a circuit for turning on the pull-down transistor before the voltage according to the operation mode is applied to the selected global word line.

5. The semiconductor memory device as recited in claim 1, wherein the connecting means is a depletion-mode transistor.

6. The semiconductor memory device as recited in claim 1, wherein the pre-charging circuits are provided with a power supply at a first high voltage, and wherein the partial row decoder selectively enables a second high voltage in a read-out operation mode, and a third high voltage in a program operation mode.

7. The semiconductor memory device as recited in claim 6, wherein the first, second, and third high voltages each have a higher potential than a voltage of the power supply of the semiconductor memory device, and wherein a circuit for generating the first high voltage is electrically insulated from a circuit for generating the second high voltage.

8. A semiconductor memory device having electrically erasable and programmable memory cells, comprising:
   a plurality of memory cell sectors having a plurality of word lines, a plurality of bit lines, and a plurality of memory cells;
   a plurality of global word lines, each electrically connected to at least one of the word lines via connecting means;
   a plurality of sector selection circuits that supply a voltage according to an operation mode via the connecting means to selected memory cell sectors;

a partial row decoder that generates partial word line driving signals that supply the voltage according to the operation mode; and a plurality of global row decoders that selectively apply the partial word line driving signals to a selected global word line via a pull-up transistor after a gate of the pull-up transistor is pre-charged to a first high voltage.

9. The semiconductor memory device as recited in claim 8, wherein the pull-up transistor is a NMOS transistor for use in a high voltage operation mode.

10. The semiconductor memory device as recited in claim 8, wherein the connecting means is a depletion-mode transistor.

11. The semiconductor memory device as recited in claim 8, wherein the global row decoders each includes a pull-down transistor connected between the global word line and ground, wherein the pull-down transistor is turned on before the voltage according to the operation mode is supplied to the selected global word line.

12. The semiconductor memory device as recited in claim 8, wherein the global row decoder applies a second high voltage to the selected global word line during a read-out operation mode and applies a third high voltage to the selected global word line during a program operation mode.

13. The semiconductor memory device as recited in claim 12, wherein the first, second, and third high voltages each has a higher potential than the voltage of the power source of the semiconductor memory device, and wherein a circuit for generating the first high voltage is electrically insulated from a circuit for generating the second high voltage.

14. In a semiconductor memory device comprising a plurality of word lines and bit lines and a plurality of memory cells, the memory cells being electrically erasable and programmable, a circuit for selecting the word lines comprising:

a plurality of global word lines connected to the word lines via connecting means, and a plurality of global row decoders having a pull-up and a pull-down transistor connected to a corresponding global word line, wherein the decoders turn on the pull-down transistor before supplying an operating mode voltage to a selected global word line and wherein the decoders pre-charge a gate of the pull-up transistor.

15. The circuit as recited in claim 14, wherein the global row decoders use a first high voltage as a power source, wherein the global row decoders supply a second high voltage to the selected global word line in a read-out operation mode, and wherein the global row decoders supply a third high voltage to the selected global word line in a program operation mode.

16. The circuit as recited in claim 15, wherein the first, second, and third high voltages have a greater potential than a voltage of the power source of the semiconductor memory device, and wherein a circuit for generating the first high voltage is electrically insulated from a circuit for generating the second high voltage.

* * * * *

UNITED STATES PATENT AND TRADEMARK OFFICE
CERTIFICATE OF CORRECTION

PATENT NO.    : 6,587,375 B2                                     Page 1 of 1
DATED         : July 1, 2003
INVENTOR(S)   : Chung et al.

It is certified that error appears in the above-identified patent and that said Letters Patent is hereby corrected as shown below:

Column 6,
Line 11, "character, "i" or "appended" should read -- character "i" or "j" appended --.
Line 42, "SBD0~SBD7, or" should read -- SBD0~SBD7, ..., or --.

Column 10,
Line 28, "GWL0-GWL7" should read -- GWL0~GWL7 --.
Line 35, "high level are" should read -- high level – are --.
Line 42, "M2, 45" should read -- M2, M5 --.

Column 12,
Line 12, "NPRE" should read -- nPRE --.

Signed and Sealed this

Eighteenth Day of May, 2004

JON W. DUDAS
*Acting Director of the United States Patent and Trademark Office*